United States Patent
Wright et al.

(10) Patent No.: US 7,912,432 B1
(45) Date of Patent: Mar. 22, 2011

(54) OUTPUT POWER DETECTION CIRCUIT WITH THRESHOLD LIMITING CHARACTERISTICS

(75) Inventors: Peter V. Wright, Portland, OR (US); Ray M. Parkhurst, Hillsboro, OR (US); Jin W. Cho, Hillsboro, OR (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 620 days.

(21) Appl. No.: 12/023,302

(22) Filed: Jan. 31, 2008

Related U.S. Application Data

(60) Provisional application No. 60/898,901, filed on Feb. 1, 2007.

(51) Int. Cl.
*H04B 1/04* (2006.01)

(52) U.S. Cl. .................. 455/127.5; 455/115.3; 455/341; 330/297

(58) Field of Classification Search .... 455/115.1–115.3, 455/127.1–127.5, 341; 330/127, 297
See application file for complete search history.

(56) References Cited

U.S. PATENT DOCUMENTS

| | | | | |
|---|---|---|---|---|
| 6,047,167 | A  * | 4/2000  | Yamashita | 455/126 |
| 6,701,138 | B2   | 3/2004  | Epperson et al. | |
| 6,850,119 | B2   | 2/2005  | Arnott | |
| 6,917,245 | B2 * | 7/2005  | Dupuis et al. | 330/279 |
| 7,315,211 | B1 * | 1/2008  | Lee et al. | 330/285 |
| 7,634,240 | B2 * | 12/2009 | Mitzlaff et al. | 455/127.3 |
| 2004/0056720 | A1 * | 3/2004 | Jansen et al. | 330/279 |

* cited by examiner

*Primary Examiner* — Nhan Le
(74) *Attorney, Agent, or Firm* — Booth Udall, PLC

(57) ABSTRACT

An output power detection circuit including a detection circuit is disclosed. The output power detection circuit further includes a summing network, wherein a first voltage input of the summing network is capable of receiving a voltage that is proportional with a current flowing through an output stage of an RF amplifier circuit, a second voltage input is coupled with the detection circuit, and an output is capable of providing a summing voltage.

12 Claims, 3 Drawing Sheets

OUTPUT POWER DETECTION CIRCUIT WITH THRESHOLD LIMITING CHARACTERISTICS

CROSS-REFERENCE TO RELATED APPLICATIONS

This application hereby claims the benefit under 35 U.S.C. §119(e) of U.S. Provisional Patent Application Ser. No. 60/898,901, filed 1 Feb. 2007, entitled "OUTPUT POWER DETECTION WITH THRESHOLD LIMITING CHARACTERISTICS".

The present invention is related to that disclosed in U.S. Provisional Patent Application Ser. No. 60/898,901. U.S. Provisional Patent Application Ser. No. 60/898,901 is assigned to the assignee of the present application. The subject matter disclosed in U.S. Provisional Patent Application Ser. No. 60/898,901 is hereby incorporated by reference into the present disclosure as if fully set forth herein.

TECHNICAL FIELD OF THE INVENTION

Embodiments of the present invention relate generally to radio frequency (RF) power amplifiers and more specifically, to an output power detection circuit with threshold limiting characteristics.

BACKGROUND OF THE INVENTION

Radio frequency (RF) power amplifiers are often used in wireless devices, such as cellular telephones. Extending the battery life is a key concern for users and manufacturers of these wireless devices. One of the key factors in determining the battery life of a wireless device is the power consumption of the RF power amplifiers. The RF power amplifiers are designed to operate into an optimal load impedance and are typically coupled to an antenna of the wireless device.

However, under a load mismatch condition, such as, for example, when the antenna of the wireless device approaches objects (e.g., metal structures, human contact, or a hand in the near field of the antenna, or the like), the load impedance of the RF power amplifier changes and the RF power amplifier draws excess current. In some cases, the current can exceed more than two times the current drawn under an optimal load impedance. When the RF power amplifier draws excess current, the battery life of the wireless device is reduced. In addition, the adjacent channel power ratio (ACPR) and error vector magnitude (EVM) linearity limits are often exceeded when the RF power amplifier draws excess current. This reduction in battery life and exceeding of the ACPR and EVM limits are undesirable.

FIG. 1 illustrates a schematic diagram of a detection circuit 100 according to the prior art. Detection circuit 100 includes RF amplifier stages A1-A3, a voltage detection $V_{DET}$ signal, an external bias control signal, an $RF_{IN}$ signal, an $RF_{OUT}$ signal, an output coupler 102, a diode D1, and a collector voltage $V_{CC}$. Output coupler 102 senses the forward output power from RF amplifier stages A1-A3 (i.e., $RF_{OUT}$ signal), which is rectified by diode D1 to provide a voltage detection $V_{DET}$ signal. The voltage detection $V_{DET}$ signal is applied to an external power control device to adjust the external bias control $Ext_{BIAS}$ signal until the detected output voltage from output coupler 102 equalizes with the power control signal voltage of the external power control device, thereby substantially maintaining a constant forward output power from RF amplifier stages A1-A3.

However, the use of detection circuit 100 is disadvantageous, because the external power control device does not provide a mechanism to limit the amount of current that is drawn by RF amplifier stages A1-A3. For example, under certain load mismatch conditions, the external power control device will continue to draw as much current as is necessary in order to maintain the forward output power of RF amplifier stages A1-A3 constant with the external power control device. Among other things, this reduces the efficiency of RF amplifier stages A1-A3 and decreases the battery life of the wireless device, which, as described above, is disadvantageous for users and manufacturers of these wireless devices.

FIG. 2 illustrates a schematic diagram of another detection circuit 200 according to the prior art. Detection circuit 200 includes RF amplifier stages A1-A3, voltage detection $V_{DET}$ signal, an external collector voltage $V_{CC}$ control signal, $RF_{IN}$ signal, RF out signal, output coupler 102, diode D1, and a bias voltage $V_{BIAS}$ signal. Detection circuit 200 is similar to detection circuit 100, except that instead of using an external power control device to adjust the bias current of RF amplifier stages A1-A3, detection circuit 200 uses the external power control device to adjust the collector voltage $V_{CC}$ of RF amplifier stages A1-A3.

However, the use of detection circuit 200 is disadvantageous, for the same reasons as discussed above with respect to detection circuit 100. In addition, implementation of a hard current limit with detection circuits 100 and 200 is not desirable, as it may adversely affect the RF characteristics of RF amplifier stages A1-A3. For example, as the output power of RF amplifier stages A1-A3 is ramping to a specified value, as defined by the external power control device, a sharp discontinuity may occur when the supply current reaches a predetermined maximum limiting value. This sharp discontinuity is commonly referred to as a hard limit and causes various spurious emissions and unwanted harmonics in the frequency domain. These spurious emissions and unwanted harmonics are undesirable.

BRIEF DESCRIPTION OF THE DRAWINGS

The novel features believed to be characteristic of embodiments of the invention are set forth in the appended claims. However, embodiments of the invention will best be understood by reference to the following detailed description when read in conjunction with the accompanying drawings, wherein embodiments of the invention are illustrated by way of example, and not by way of limitation, in the figures of the accompanying drawings in which like reference numerals refer to similar elements.

DETAILED DESCRIPTION OF THE INVENTION

Reference will now be made to the following detailed description of the exemplary embodiments of the present invention. Those skilled in the art will recognize that embodiments of the present invention provide many inventive concepts and novel features that are merely illustrative and not to be construed as restrictive. Accordingly, the specific embodiments discussed herein are given by way of example and do not limit the scope of the embodiments of the present invention. In addition, those skilled in the art will understand that for purposes of explanation, numerous specific details are set forth, though embodiments of the invention can be practiced without these specific details, and that certain features have been omitted so as to more clearly illustrate embodiments of the invention.

Figure 1:
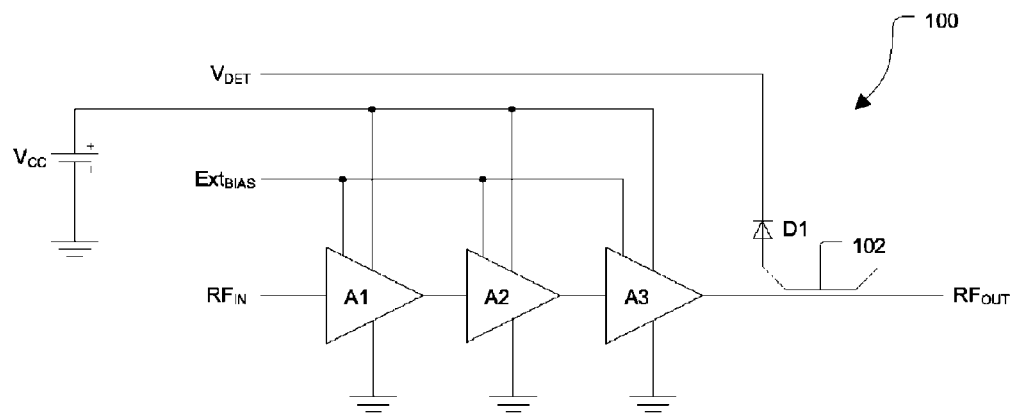
FIG. 1 illustrates a schematic diagram of a detection circuit according to the prior art.
Figure 2:
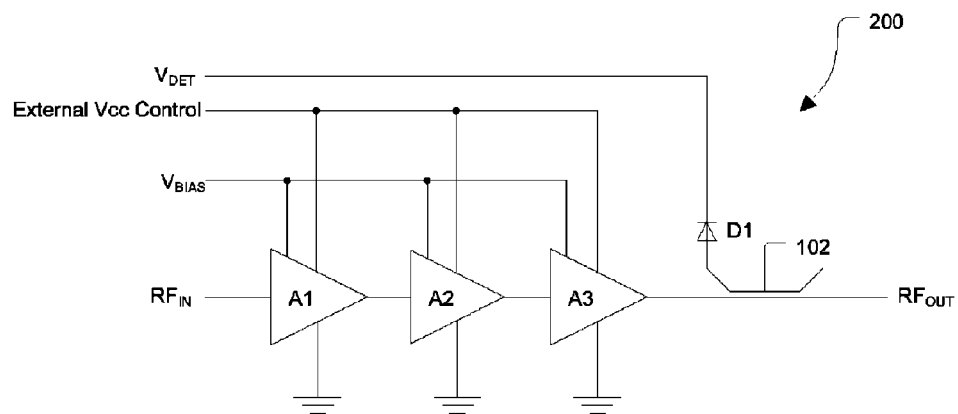
FIG. 2 illustrates a schematic diagram of another detection circuit according to the prior art.
Figure 3:
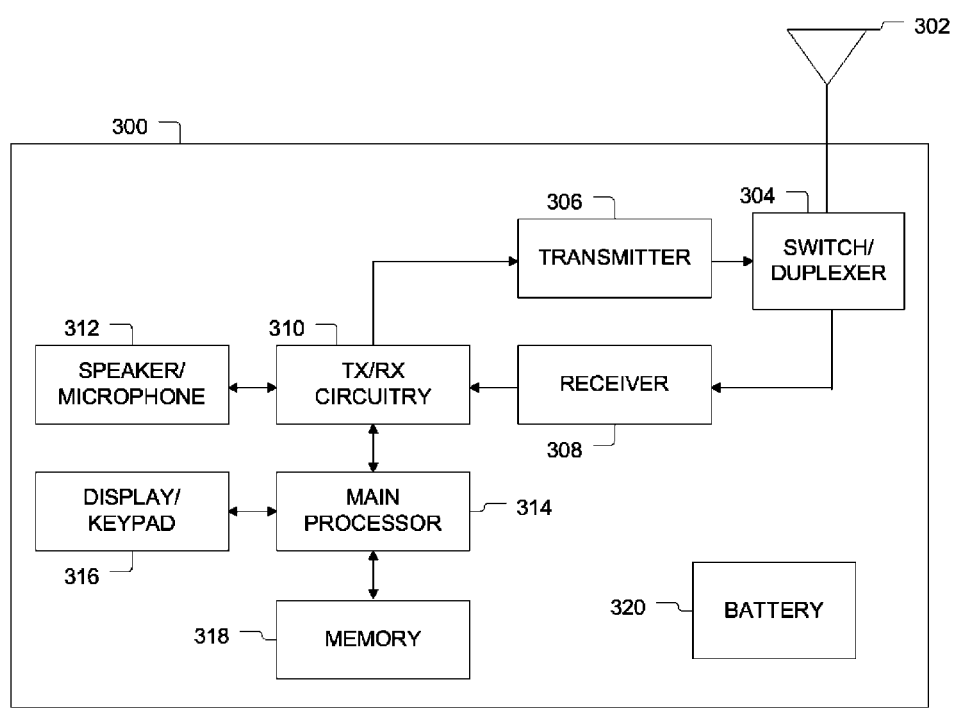
FIG. 3 illustrates a high-level block diagram of a wireless device according to an exemplary embodiment of the present invention.

FIG. 3 illustrates a high-level block diagram of a wireless device 300 according to an exemplary embodiment of the present invention. In one embodiment of the present invention, wireless device 300 comprises an antenna 302, a switch/duplexer 304, a transmitter 306, a receiver 308, TX/RX circuitry 310, a speaker/microphone 312, a main processor 314, a display/keypad 316, a memory 318, and a battery 320. Wireless device 300 may be any wireless device, including, but not limited to, conventional cellular telephones, paging devices, personal digital assistant devices, text-messaging devices, portable computers, or any other like device capable of wireless communication.

As will be explained below in greater detail, transmitter 306 comprises radio frequency (RF) power amplifier circuitry including output power detection circuitry, one or more RF power amplifier stages, and other like circuitry. In one embodiment of the present invention, the RF power amplifier circuitry of transmitter 306 is formed on a Gallium Arsenide (GaAs) substrate. However, other semiconductor materials (e.g., silicon, silicon germanium, indium phosphide, gallium nitride, silicon carbide, aluminum gallium arsenide; indium gallium arsenide; indium gallium phosphide; indium aluminum arsenide; aluminum gallium nitride; indium gallium nitride; gallium arsenide antimonide; indium gallium arsenide nitride; and aluminum arsenide) may be used. In addition, for purposes of illustration and ease of explanation, embodiments of the present invention are described in terms of bipolar junction transistor (BJT) technology (e.g., heterojunction bipolar transistors (HBTs)). However, embodiments of the invention may be practiced using other transistor technology, including, for example, but not limited to, field effect transistor (FET) technology (e.g., junction field effect transistors, heterostructure field effect transistors, modulation-doped field effect transistors, metal-semiconductor field effect transistors (MESFETs), high electron mobility transistors, metamorphic high electron mobility transistors, and pseudomorphic high electron mobility transistors (pHEMTs)) or complementary metal-oxide semiconductor (CMOS) technology.

TX/RX circuitry 310 receives from antenna 302 an incoming signal transmitted by, for example, a communication system or a wireless network provider, through switch/duplexer 304 and receiver 308. TX/RX circuitry 310 processes and sends the incoming signal to the speaker (i.e., voice data) or to main processor 314 (e.g., web browsing) for further processing. Likewise, TX/RX circuitry 310 receives analog or digital voice data from the microphone or other outgoing data (e.g., web data, e-mail) from main processor 314. TX/RX circuitry 310 transmits an RF signal that is transmitted through transmitter 306 via antenna 302.

Main processor 314 executes a basic operating system program stored in memory 318 in order to control the overall operation of wireless device 300. For example, main processor 314 controls the reception of signals and the transmission of signals by TX/RX circuitry 310, receiver 308, and transmitter 306. Main processor 314 is capable of executing other processes and programs resident in memory 318 and may move data into or out of memory 318, as required by an executing process.

Main processor 314 is also coupled to display/keypad 316. The user of wireless device 300 uses the keypad to enter data into wireless device 300. The display may be a liquid crystal display capable of rendering text and/or at least various graphics; alternate embodiments may use other types of displays. Battery 320 is coupled with the electrical components of wireless device 300, in accordance with known electrical principles.

Those skilled in the art will recognize that wireless device 300 is given by way of example and that for simplicity and clarity, only so much of the construction and operation of wireless device 300 as is necessary for an understanding of the present invention is shown and described. For example, wireless device 300 is capable of communicating using one or more of a number of conventional standards, including, but not limited to GSM/EDGE, CDMA, W-CDMA, or the like. In addition, or as an alternative, although an exemplary wireless device 300 is shown and described, embodiments of the present invention contemplate any suitable component or combination of components performing any suitable tasks in association with wireless device 300, according to particular needs. Moreover, it is understood that wireless device 300 should not be construed to limit the types of devices in which embodiments of the present invention may be implemented.

In accordance with the principles of embodiments of the present invention, the RF power amplifier circuitry of transmitter 306 of wireless device 300 provides for maintaining certain parameters within the RF power amplifier circuitry above certain threshold levels, as described below in greater detail. In addition, or as an alternative, below the threshold levels, the RF power amplifier circuitry control-loop parameters are unchanged.

Figure 4:
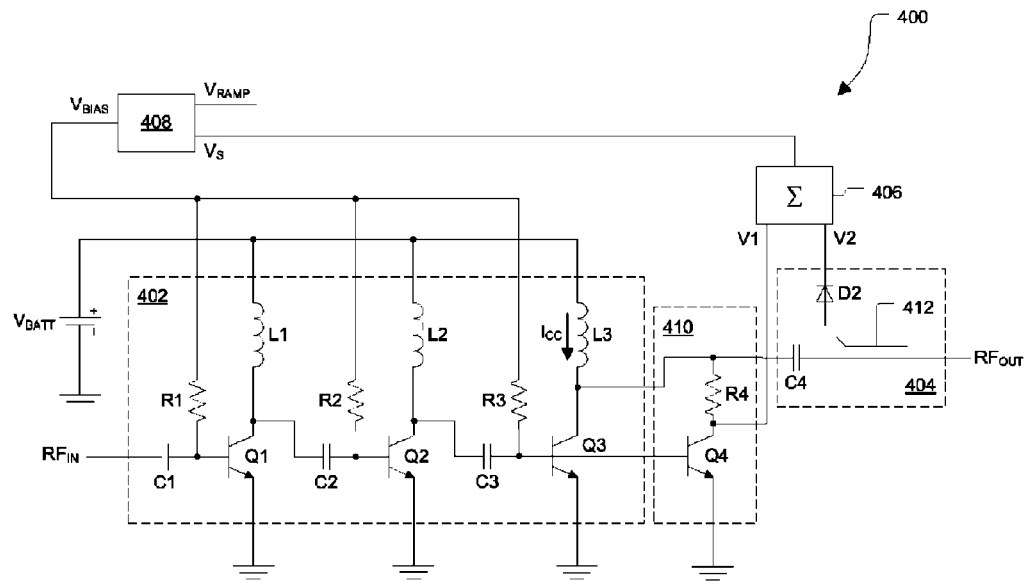
FIG. 4 illustrates a schematic diagram of an output power detection circuit according to one embodiment of the present invention.

FIG. 4 illustrates a schematic diagram of an output power detection circuit 400 according to one embodiment of the present invention. Output power detection circuit 400 comprises RF amplifier circuit 402, detection circuit 404, a summing network 406, a control circuit 408, a mirror circuit 410, a $V_{RAMP}$ signal, an $RF_{IN}$ signal, an $RF_{OUT}$ signal, and a battery voltage $V_{BATT}$. RF amplifier circuit 402 comprises transistors Q1-Q3, resistors R1-R3, inductors L1-L3, and capacitors C1-C3. Although RF amplifier circuit 402 is shown and described as having only these components, any number of transistors, capacitors, resistors, inductors, or other components may be used.

Detection circuit 404 comprises a capacitor C4, a diode D2, and a coupler 412. Although detection circuit 404 is shown and described as having a single capacitor C4, a single diode D2, and a single coupler 412, embodiments of the present invention contemplate any circuit which detects the output power of RF amplifier circuit 402 and provides an output signal corresponding to that output power. Mirror circuit 410 comprises a transistor Q4 and a resistor R4. Although mirror circuit 410 is shown and described as having a single transistor Q4 and a single resistor R3, embodiments of the present invention contemplate any suitable transistor or components performing the same or substantially similar function as mirror circuit 410.

In one embodiment of the present invention, transmitter 306 of wireless device 300 of FIG. 3 comprises RF power amplifier circuitry including output power detection circuit 400. In addition, or as an alternative, transistors Q1-Q3 of RF amplifier circuit 402 are RF amplifier stages associated with the RF power amplifier circuitry of wireless device 300. RF amplifier circuit 402 may be driven by the $RF_{IN}$ signal via a RF driver stage or by TX/RX circuitry 310 of wireless device 300. In addition, RF amplifier circuit 402 may transmit the $RF_{OUT}$ signal into a load. In one embodiment of the present invention, the load may be an antenna and may be, for example, antenna 302 of wireless device 300. RF amplifier circuit 402, and in particular transistor Q3, may experience a load mismatch of antenna 302 of wireless device 300.

To further explain the operation of output power detection circuit 400, an example is now given. In the following example, transistor Q3 experiences a load mismatch condition, such as, for example, when antenna 302 of wireless device 300 comes in close proximity with objects, for example, a hand, in the near field of antenna 302, or the like. Although a load mismatch condition of transistor Q3 of RF amplifier circuit 402 is described as a load mismatch generated from an antenna mismatch condition, embodiments the present invention contemplate any suitable load mismatch condition. For example, a load mismatch condition may be any load mismatch condition that causes collector current $I_{CC}$ to increase in transistor Q3 of RF amplifier circuit 402, thereby increasing the power consumption and decreasing the battery life or exceeding the adjacent channel power ratio (ACPR) and error vector magnitude (EVM) limits of wireless device 300.

In an embodiment of the present invention, transistor Q4 of mirror circuit 410, is a current mirror transistor, and is coupled in parallel with transistor Q3 of RF amplifier circuit 402, such that the base of transistor Q3 is coupled with the base of transistor Q4 and the collector of transistor Q3 is coupled with the collector of transistor Q4 via a resistor R4. Since transistor Q4 is configured as a current mirror transistor, transistor Q4 senses a portion of the current flowing through transistor Q3, such that the current flowing through transistor Q4 is proportional to the current flowing through transistor Q3.

In addition, because transistor Q4 is configured as a current mirror transistor, transistor Q4 may be sized smaller than, for example, the size of transistor Q3. As an example only and not by way of limitation, transistor Q3 may be sized to handle several amps of current flowing through transistor Q3, wherein transistor Q4 may be sized to handle only a hundredth of the current flowing through transistor Q3. However, even though transistor Q4 may be sized smaller than transistor Q3, the current flowing through transistor Q4 is still proportional to the current flowing through transistor Q3.

Furthermore, because, as discussed above, transistor Q4 is a current mirror transistor, transistor Q4 generates a voltage V1, which is representative of the current flowing through transistor Q3. In addition, or as an alternative, the value of resistor R4 determines the ratio between the current flowing through transistor Q3 and the current flowing through transistor Q4. Thus, in accordance with the principles of embodiments of the present invention, the current flowing through transistor Q4 generates a voltage V1 that is proportional to collector current $I_{CC}$. Transistor Q4 provides a voltage V1 at one input of summing network 406.

In an embodiment of the present invention, output coupler 412 detects the output power of RF amplifier circuit 402. The detected output power of RF amplifier circuit 402 is rectified by diode D2 to provide a voltage V2 at another input of summing network 406, wherein voltage V2 is proportional to the output power of RF amplifier circuit 402. Voltages V1 and V2 are then applied to summing network 406.

Summing voltage $V_S$ of summing network 406 has the following dependence on voltages V1 and V2:

$$V_S = \alpha \times V2 + \beta \times \max(0, I_{CC} - I_T) \quad (1)$$

where $\alpha$ and $\beta$ are fixed gains and threshold current $I_T$ is a threshold value that is set during the design phase of output power detection circuit 400. In addition, $\alpha$ and $\beta$ provide the ability to determine how aggressively collector current $I_{CC}$ is limited by the threshold value of threshold current $I_T$.

To further explain the threshold value of threshold current $I_T$, an example is now given. In the following example, the maximum current of RF amplifier circuit 402 may require a current limit, such as, for example, 2.3 Amps. The threshold value of threshold current $I_T$ may be set to any value below the current limit, such as, for example, 2.0 Amps. Although an example maximum current and an example threshold current $I_T$ is described, embodiments of the present invention contemplate using any maximum current or any threshold value of threshold current $I_T$.

As shown and described in equation 1, when collector current $I_{CC}$ is below the threshold value of threshold current $I_T$, the control-loop parameters of output power detection circuit 400 are unchanged. For example, when collector current $I_{CC}$ is below the threshold value of threshold current $I_T$, 0 is the maximum as between 0 and ($I_{CC}-I_T$). Thus, multiplying $\beta$ by 0 eliminates $\beta$ from the calculation of summing voltage $V_S$, and summing voltage $V_S$ is proportional to the output power of RF amplifier circuit 402 because V2 is proportional to the output power of RF amplifier circuit 402. In addition, when collector current $I_{CC}$ is equal to the threshold value of threshold current $I_T$, the control-loop parameters of output power detection circuit 400 are also unchanged because, collector current $I_{CC}$ minus threshold current $I_T$ is equal to zero, (i.e., ($I_{CC}-I_T$=0)).

However, when collector current $I_{CC}$ exceeds the threshold value of threshold current $I_T$, there is excess current, and summing voltage $V_S$ is increased by an amount proportional to the excess current. For example, summing voltage $V_S$ is the output of summing network 406, is input into control circuit 408 and results in a reduction of bias voltage $V_{BIAS}$, thereby limiting the excess current.

The form of bias voltage $V_{BIAS}$ dependence is:

$$V_{BIAS} = G1 \times V_{RAMP} - G2 \times \max(0, I_{CC} - I_T) \quad (2)$$

where G1 and G2 are fixed gains. It is important to note, with reference to equation (2), that below the threshold value of threshold current $I_T$, bias voltage $V_{BIAS}$ is proportional to the $V_{RAMP}$ signal, with an essentially fixed gain G1. However, once collector current $I_{CC}$ exceeds the threshold value of threshold current $I_T$, the dependence of bias voltage $V_{BIAS}$ on the $V_{RAMP}$ signal is progressively reduced with increasing current. Among other things, the continuity in bias voltage $V_{BIAS}$ coupled with the ability to adjust the gain about the threshold value of threshold current $I_T$, provides control-loop stability for output power detection circuit 400 and minimizes any spurious emissions associated with RF amplifier circuit 402.

Although control circuit 408 is shown and described as supplying the bias voltage $V_{BIAS}$ of transistors Q1-Q3 of RF amplifier circuit 402, embodiments of the present invention contemplate supplying transistor Q3, or transistor Q1 and/or Q2, or any combination of transistors. In addition, although control circuit 408 is shown and described as comparing summing voltage $V_S$ and the $V_{RAMP}$ signal, embodiments of the present invention contemplate any circuit which detects a difference in two voltage levels and outputs a signal corresponding to this difference.

As described above, the threshold value of threshold current $I_T$ may be set to any value below a maximum current limit using output power detection circuit 400. However, unlike in the prior art, no abrupt discontinuity occurs in bias voltage $V_{BIAS}$ as a function of the $V_{RAMP}$ signal at the threshold value of threshold current $I_T$. Embodiments of the present invention use the threshold value of threshold current $I_T$ to progressively reduce the increasing current associated with RF amplifier circuit 402 as bias voltage $V_{BIAS}$ is increased in response to the $V_{RAMP}$ signal. Among other things, this reduces any spurious emissions and unwanted harmonics in the frequency domain of embodiments of the present invention, which enables embodiments of the present invention to provide control-loop stability of output power detection circuit 400.

In addition, because the maximum current of RF amplifier circuit 402 is limited under load mismatch conditions, the battery life of, for example, battery 320, of wireless device 300 is increased relative to prior art circuits that do not limit the maximum current. Among other things, this increases the talk time associated with wireless device 300, improves the ruggedness of RF amplifier circuit 402, and reduces any excessive heating associated with output power detection circuit 400.

Figure 5:
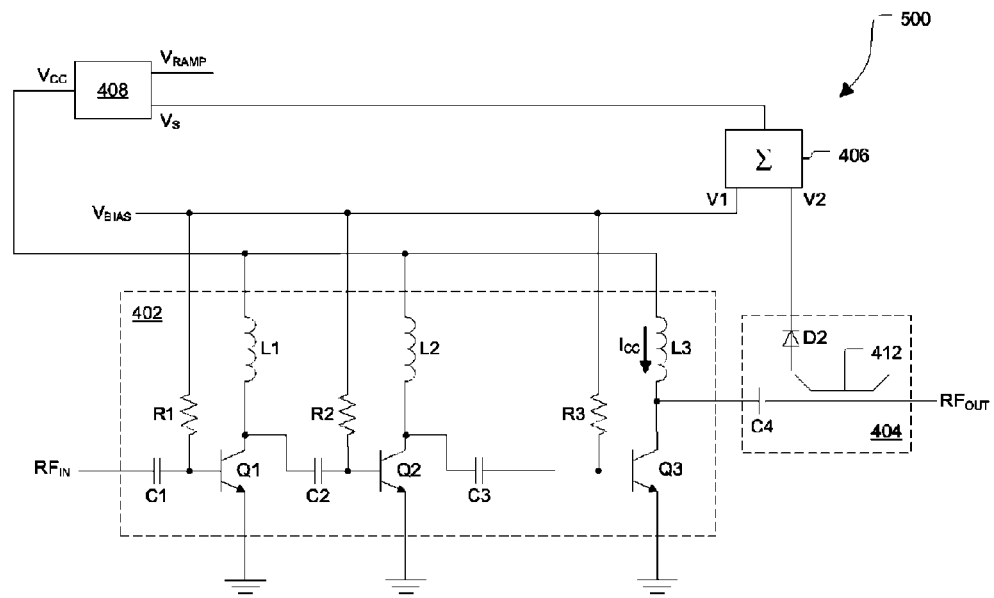
FIG. 5 illustrates a schematic diagram of an output power detection circuit according to another embodiment of the present invention.

FIG. 5 illustrates a schematic diagram of an output power detection circuit 500 according to another embodiment of the present invention. Output power detection circuit 500 comprises RF amplifier circuit 402, detection circuit 404, summing network 406, control circuit 408, $RF_{IN}$ signal, $RF_{OUT}$ signal, and a bias voltage $V_{BIAS}$ signal. As discussed above, although RF amplifier circuit 402 is shown in FIG. 5 and described above as having only certain components, any number of transistors, capacitors, resistors, inductors, or other components may be used. In addition, although detection circuit 404 is shown in FIG. 5 and described above as having a single capacitor C4, a single diode D2, and a single coupler 412, embodiments of the present invention contemplate any circuit which detects the output power and provides an output signal corresponding to that output power.

Output power detection circuit 500 is similar to output power detection circuit 400, except that rather than using current mirror circuit 410 to generate voltage V1, embodiments of the present invention operate in conjunction with the bias network associated with RF amplifier circuit 402 to generate voltage V1. As an example only, and not by way of limitation, the bias network of RF amplifier circuit 402 generates a voltage V1 that is proportional to collector current $I_{CC}$ flowing through transistor Q3.

In one embodiment of the present invention, voltage V1 is generated from the bias network associated with transistor Q3 of RF amplifier circuit 402. Although voltage V1 is shown and described as generated from the bias network associated with transistor Q3, embodiments of the present invention contemplate generating voltage V1 from the bias network associated with transistor Q1, transistor Q2, transistor Q3 or any combination of bias networks of RF amplifier circuit 402. In addition, as described above, voltages V1 and V2 are applied to summing network 406 and therefore, equation 1 is likewise valid for output power detection circuit 500.

In addition, as described above, when collector current $I_{CC}$ exceeds the threshold value of threshold current $I_T$, there is excess current, and summing voltage $V_S$ is increased by an amount proportional to the excess current. For example, summing voltage $V_S$, which is the output of summing network 406, is input into control circuit 408 and results in a reduction of collector voltage $V_{CC}$, thereby limiting the excess current.

The form of the collector voltage $V_{CC}$ dependence is:

$$V_{CC} = G1 \times V_{RAMP} - G2 \times \max(0, I_{CC} - I_T) \quad (3)$$

where G1 and G2 are fixed gains. It is important to note, with reference to equation (3), that below the threshold value of threshold current $I_T$, collector voltage $V_{CC}$ is proportional to the $V_{RAMP}$ signal, with an essentially fixed gain G1. However, once collector current $I_{CC}$ exceeds the threshold value of threshold current $I_T$, the dependence of collector voltage $V_{CC}$ on the $V_{RAMP}$ signal is progressively reduced with increasing current. Among other things, the continuity in collector voltage $V_{CC}$ coupled with the ability to adjust the gain about the threshold value of threshold current $I_T$, provides control-loop stability for output power detection circuit 500 and minimizes any spurious emissions associated with RF amplifier circuit 402.

Although control circuit 408 is shown and described as supplying the collector voltage $V_{CC}$ of transistors Q1-Q3 of RF amplifier circuit 402, embodiments of the present invention contemplate supplying transistor Q3, or transistor Q1 and/or Q2, or any combination of transistors. In addition, as described above, although control circuit 408 is shown and described as comparing summing voltage $V_S$ and the $V_{RAMP}$ signal, embodiments of the present invention contemplate any circuit which detects a difference in two voltage levels and outputs a signal corresponding to this difference.

As described above, the threshold value of threshold current $I_T$ may be set to any value below a maximum current limit using output power detection circuit 500. However, unlike in the prior art, no abrupt discontinuity occurs in collector voltage $V_{CC}$ as a function of the $V_{RAMP}$ signal at the threshold value of threshold current $I_T$. Embodiments of the present invention use the threshold value of threshold current $I_T$ to progressively reduce the increasing current associated with RF amplifier circuit 402 as collector voltage $V_{CC}$ is increased in response to the $V_{RAMP}$ signal. Among other things, this reduces any spurious emissions and unwanted harmonics in the frequency domain of embodiments of the present invention, which enables embodiments of the present invention to provide control-loop stability of output power detection circuit 500.

In one embodiment of the present invention, transmitter 306 of wireless device 300 of FIG. 3 comprises RF power amplifier circuitry including output power detection circuit 500. As discussed above, transistors Q1-Q3 of RF amplifier circuit 402 are RF amplifier stages associated with the RF power amplifier circuitry of wireless device 300 and may be driven by the $RF_{IN}$ signal via a RF driver stage or by TX/RX circuitry 310 of wireless device 300. In addition, RF amplifier circuit 402 may transmit the $RF_{OUT}$ signal into a load, which may be an antenna and may be, for example, antenna 302 of wireless device 300. RF amplifier circuit 402, and in particular transistor Q3, may experience a load mismatch of antenna 302 of wireless device 300.

Thus, in accordance with the principles of embodiments of the present invention, when the current increases in the bias network associated with RF amplifier circuit 402, collector voltage $V_{CC}$ is adjusted to limit the maximum collector current $I_{CC}$ of RF amplifier circuit 402. Among other things, this decreases the power consumption and increases the battery life of, for example, battery 320, of wireless device 300 relative to prior art circuits that do not limit the maximum current. In addition, among other things, this increases the talk time associated with wireless device 300, improves the ruggedness of RF amplifier circuit 402, and reduces any excessive heating associated with output power detection circuit 500.

Reference in the foregoing specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

While the exemplary embodiments of the present invention have been shown and described, it will be understood that various changes and modifications to the foregoing embodiments may become apparent to those skilled in the art without departing from the spirit and scope of the present invention. Accordingly, the invention is not limited to the embodiments disclosed, but rather by the appended claims and their equivalents.

What is claimed is:

1. A circuit, comprising:
   a detection circuit coupled with an output stage of a radio frequency (RF) amplifier circuit; and
   a summing network having a first voltage input, a second voltage input, and an output, wherein the first voltage input is capable of receiving a voltage that is proportional with a current flowing through the output stage of the RF amplifier circuit, the second voltage input is coupled with the detection circuit, and the output is capable of providing a summing voltage;
   wherein: the output of the summing network is a summing voltage based on:

$$V_S = \alpha \times V2 + \beta \times \max(0, I - I_T)$$

wherein $\alpha$ and $\beta$ are representative of fixed gains, $I_T$ is representative of a threshold value of a threshold current, I is representative of the current flowing through the output stage of the RF amplifier circuit, and V2 is the voltage at the second voltage input of the summing network.

2. The circuit of claim 1, further comprising:
   a control circuit having a first input, a second input, and an output, wherein the first input of the control circuit is coupled with the output of the summing network, the second input of the control circuit is coupled with a voltage ramp signal, and the output of the control circuit is capable of providing a control voltage.

3. The circuit of claim 2, wherein:
   a form of the voltage of the RF amplifier circuit is based on:

$$V = G1 \times V_{RAMP} - G2 \times \max(0, I - I_T)$$

wherein G1 and G2 are representative of other fixed gains, $I_T$ is representative of the threshold value of the threshold current, I is representative of the current flowing through the output stage of the RF amplifier circuit, and $V_{RAMP}$ is the voltage ramp signal applied at the second input of the control circuit.

4. The circuit of claim 2, wherein the output of the control circuit is coupled with at least the output stage of the RF amplifier circuit.

5. The circuit of claim 2, wherein the output of the control circuit is coupled with a bias network of the RF amplifier circuit.

6. The circuit of claim 1, further comprising a mirror circuit coupled between the output stage of the RF amplifier circuit and the first voltage input of the summing network, wherein a current through the mirror circuit is proportional with the current flowing through the output stage of the RF amplifier circuit.

7. The circuit of claim 6, wherein the mirror circuit comprises a transistor having a base, a collector, and an emitter, the base of transistor is coupled with the output stage of the RF amplifier circuit, the collector of the transistor is coupled with the first voltage input of the summing network, and the emitter of the transistor is coupled with a ground.

8. The circuit of claim 7, further comprising a resistor coupled between the collector of the transistor and the output stage of the RF amplifier circuit.

9. The circuit of claim 1, wherein the detection circuit comprises:
   a coupler coupled with the output stage of the RF amplifier circuit; and
   a diode coupled between the coupler and the second input of the summing network.

10. The circuit of claim 1, wherein the first voltage input of the summing network is coupled with a bias network of the RF amplifier circuit.

11. The circuit of claim 1, wherein at least the output stage of the RF amplifier circuit is fabricated in a semiconductor technology selected from the group consisting of:
    pseudomorphic high electron mobility transistor;
    metal semiconductor field effect transistor;
    junction field effect transistor;
    high electron mobility transistor;
    metamorphic high electron mobility transistor;
    complementary metal-oxide semiconductor field effect transistor;
    heterostructure field effect transistor; and
    modulation-doped field effect transistor.

12. The circuit of claim 11, wherein the semiconductor technology includes material selected from the group consisting of:
    Gallium Arsenide;
    Silicon;
    Indium Phosphide;
    Gallium Nitride;
    Aluminum Gallium Arsenide;
    Indium Gallium Arsenide;
    Indium Gallium Phosphide;
    Indium Aluminum Arsenide;
    Aluminum Gallium Nitride;
    Indium Gallium Nitride;
    Gallium Arsenide Antimonide;
    Indium Gallium Arsenide Nitride; and
    Aluminum Arsenide.

* * * * *